United States Patent
Dressler et al.

(10) Patent No.: US 9,804,234 B2
(45) Date of Patent: Oct. 31, 2017

(54) MAGNETORESISTANCE ELEMENT WITH AN IMPROVED SEED LAYER TO PROMOTE AN IMPROVED RESPONSE TO MAGNETIC FIELDS

(71) Applicant: Allegro MicroSystems, LLC, Worcester, MA (US)

(72) Inventors: Cyril Dressler, Tullins (FR); Claude Fermon, Orsay (FR); Myriam Pannetier-Lecoeur, Bures sur Yvette (FR); Marie-Claire Cyrille, Sinard (FR); Paolo Campiglio, Montrouge (FR)

(73) Assignees: Allegro MicroSystems, LLC, Worcester, MA (US); Commissariat à L'Energie Atomique et aux Energies Alternatives, Paris (FR)

( * ) Notice: Subject to any disclaimer, the term of this patent is extended or adjusted under 35 U.S.C. 154(b) by 311 days.

(21) Appl. No.: 14/591,213

(22) Filed: Jan. 7, 2015

(65) Prior Publication Data

US 2015/0192649 A1 Jul. 9, 2015

Related U.S. Application Data

(60) Provisional application No. 61/925,446, filed on Jan. 9, 2014.

(51) Int. Cl.
*G11B 5/39* (2006.01)
*G01R 33/09* (2006.01)
(Continued)

(52) U.S. Cl.
CPC ......... *G01R 33/09* (2013.01); *G01R 33/0052* (2013.01); *G01R 33/093* (2013.01);
(Continued)

(58) Field of Classification Search
CPC ................ G11B 5/39; G11B 5/3906
(Continued)

(56) References Cited

U.S. PATENT DOCUMENTS 5,282,104 A 1/1994 Coutellier et al.
5,677,625 A 10/1997 Dieny
(Continued)

FOREIGN PATENT DOCUMENTS

CN 201622299 11/2010
CN 101900754 12/2010
(Continued)

OTHER PUBLICATIONS

Lee et al.; "Critical Thickness Effects of NiFeCr—CoFe Seed Layers for Spin Valve Multilayers;" IEEE Transactions on Magnetics, vol. 40, No. 4; Jul. 20024; pp. 2209-2211.
(Continued)

*Primary Examiner* — Jefferson Evans
(74) *Attorney, Agent, or Firm* — Daly, Crowley, Mofford & Durkee, LLP (57) ABSTRACT

A magnetoresistance element can have a substrate; a ferromagnetic seed layer consisting of a binary alloy of NiFe; and a first nonmagnetic spacer layer disposed under and directly adjacent to the ferromagnetic seed layer and proximate to the substrate, wherein the first nonmagnetic spacer layer is comprised of Ta or Ru. A method fabricating of fabricating a magnetoresistance element can include depositing a seed layer structure over a semiconductor substrate, wherein the depositing the seed layer structure includes depositing at least a ferromagnetic seed layer over the substrate. The method further can further include depositing a free layer structure over the seed layer structure, wherein the depositing the ferromagnetic seed layer comprises depositing the ferromagnetic seed layer in the presence of a motion along
(Continued)

a predetermined direction and in the presence of a predetermined magnetic field having the same predetermined direction.

40 Claims, 4 Drawing Sheets

(51) Int. Cl.
| | |
|---|---|
| *G01R 33/00* | (2006.01) |
| *H01L 43/02* | (2006.01) |
| *H01L 43/08* | (2006.01) |
| *H01L 43/10* | (2006.01) |
| *H01L 43/12* | (2006.01) |
| *H01F 10/32* | (2006.01) |
| *H01F 41/30* | (2006.01) |

(52) U.S. Cl.
CPC .............. *G01R 33/098* (2013.01); *G11B 5/39* (2013.01); *G11B 5/3903* (2013.01); *G11B 5/3906* (2013.01); *G11B 5/3909* (2013.01); *G11B 5/3929* (2013.01); *G11B 5/3932* (2013.01); *H01F 10/3263* (2013.01); *H01F 10/3272* (2013.01); *H01F 41/306* (2013.01); *H01L 43/02* (2013.01); *H01L 43/08* (2013.01); *H01L 43/10* (2013.01); *H01L 43/12* (2013.01); *G11B 2005/3996* (2013.01); *Y10T 29/41* (2015.01)

(58) Field of Classification Search
USPC .................................. 360/320, 324.1, 324.12
See application file for complete search history.

(56) References Cited

U.S. PATENT DOCUMENTS

| | | | |
|---|---|---|---|
| 5,821,517 A | 10/1998 | Fedeli et al. | |
| 5,858,125 A | 1/1999 | Hasegawa | |
| 5,895,727 A | 4/1999 | Hasegawa | |
| 5,923,514 A | 7/1999 | Scott et al. | |
| 5,933,306 A | 8/1999 | Santos et al. | |
| 6,013,365 A | 1/2000 | Dieny et al. | |
| 6,026,355 A | 2/2000 | Rahman et al. | |
| 6,069,476 A | 5/2000 | Vieux-Rochaz et al. | |
| 6,094,330 A | 7/2000 | Criniti et al. | |
| 6,141,197 A | 10/2000 | Kim et al. | |
| 6,278,592 B1* | 8/2001 | Xue | B82Y 10/00 360/324.11 |
| 6,373,247 B1 | 4/2002 | Marx et al. | |
| 6,411,476 B1* | 6/2002 | Lin | B82Y 10/00 360/324.11 |
| 6,429,640 B1 | 8/2002 | Daughton et al. | |
| 6,462,641 B1 | 10/2002 | Dieny et al. | |
| 6,490,140 B1 | 12/2002 | Mao et al. | |
| 6,522,132 B1 | 2/2003 | Vieus-Rochaz et al. | |
| 6,532,164 B2 | 3/2003 | Redon et al. | |
| 6,603,677 B2 | 8/2003 | Redon et al. | |
| 6,770,382 B2 | 8/2004 | Chang et al. | |
| 7,095,596 B2 | 8/2006 | Schmollngruber et al. | |
| 7,106,046 B2 | 9/2006 | Nagano et al. | |
| 7,176,679 B2 | 2/2007 | Baragatti et al. | |
| 7,288,931 B2 | 10/2007 | Granig et al. | |
| 7,394,247 B1 | 7/2008 | Guo et al. | |
| 7,453,672 B2 | 11/2008 | Dieny et al. | |
| 7,463,016 B2 | 12/2008 | Shoji | |
| 7,472,004 B2 | 12/2008 | Hara et al. | |
| 7,713,755 B1 | 5/2010 | Xiao | |
| 7,759,933 B2 | 7/2010 | Coillot et al. | |
| 7,799,179 B2 | 9/2010 | Maass et al. | |
| 7,813,202 B2 | 10/2010 | Rodmacq et al. | |
| 7,855,555 B2 | 12/2010 | Biziere et al. | |
| 7,902,811 B2 | 3/2011 | Shoji | |
| 7,944,205 B2 | 5/2011 | Fermon et al. | |
| 7,944,736 B2 | 5/2011 | Dieny et al. | |
| 8,093,886 B2 | 1/2012 | Okada et al. | |
| 8,129,988 B2 | 3/2012 | Fermon et al. | |
| 8,279,666 B2 | 10/2012 | Dieny et al. | |
| 8,422,176 B1 | 4/2013 | Leng et al. | |
| 8,487,701 B2 | 7/2013 | Boujamaa et al. | |
| 8,513,944 B2 | 8/2013 | Rodmacq et al. | |
| 8,542,072 B2 | 9/2013 | Dieny et al. | |
| 8,624,590 B2 | 1/2014 | Dieny | |
| 8,638,529 B1* | 1/2014 | Leng | G11B 5/3906 360/313 |
| 8,669,122 B2 | 3/2014 | Viala et al. | |
| 8,743,507 B1* | 6/2014 | Hassan | G01R 33/093 360/125.3 |
| 8,779,764 B2 | 7/2014 | Meguro et al. | |
| 8,836,317 B2 | 9/2014 | Kasajima | |
| 8,847,589 B2 | 9/2014 | Walther et al. | |
| 9,093,102 B1* | 7/2015 | Gong | G11B 5/851 |
| 2002/0061421 A1 | 5/2002 | Dieny | |
| 2002/0158626 A1 | 10/2002 | Shay et al. | |
| 2002/0171417 A1 | 11/2002 | Schoedlbauer | |
| 2002/0191356 A1* | 12/2002 | Hasegawa | B82Y 10/00 360/324.11 |
| 2003/0002226 A1* | 1/2003 | Lin | B82Y 10/00 360/314 |
| 2003/0053266 A1 | 3/2003 | Dieny et al. | |
| 2003/0070497 A1 | 4/2003 | Kikuchi et al. | |
| 2003/0218840 A1 | 11/2003 | Apel et al. | |
| 2003/0226409 A1 | 12/2003 | Steele et al. | |
| 2004/0056647 A1 | 3/2004 | Stauth et al. | |
| 2004/0056654 A1 | 3/2004 | Goldfine et al. | |
| 2004/0207035 A1 | 10/2004 | Witcraft et al. | |
| 2004/0263157 A1 | 12/2004 | Sudo et al. | |
| 2005/0180059 A1 | 8/2005 | Gill | |
| 2006/0002184 A1* | 1/2006 | Hong | B82Y 10/00 365/171 |
| 2006/0038407 A1 | 2/2006 | Shelley et al. | |
| 2006/0077598 A1 | 4/2006 | Taylor et al. | |
| 2006/0091993 A1 | 5/2006 | Shoji | |
| 2006/0114098 A1 | 6/2006 | Shoji | |
| 2006/0193089 A1 | 8/2006 | Li et al. | |
| 2006/0214656 A1 | 9/2006 | Sudo et al. | |
| 2007/0019341 A1 | 1/2007 | Mizuno et al. | |
| 2007/0044370 A1 | 3/2007 | Shoji | |
| 2007/0076332 A1 | 4/2007 | Shoji et al. | |
| 2007/0164734 A1 | 7/2007 | Shimizu et al. | |
| 2008/0031035 A1 | 2/2008 | Rodmaco et al. | |
| 2008/0098167 A1 | 4/2008 | Rodmaco et al. | |
| 2008/0151615 A1 | 6/2008 | Rodmacq et al. | |
| 2008/0171223 A1* | 7/2008 | Wang | B82Y 10/00 428/675 |
| 2008/0316655 A1 | 12/2008 | Shoji | |
| 2009/0015972 A1 | 1/2009 | Dieny et al. | |
| 2009/0021249 A1 | 1/2009 | Kumar et al. | |
| 2009/0087589 A1 | 4/2009 | Guo et al. | |
| 2009/0115405 A1 | 5/2009 | Guo | |
| 2009/0161268 A1 | 6/2009 | Lin | |
| 2009/0189601 A1 | 7/2009 | Okada et al. | |
| 2009/0192755 A1 | 7/2009 | Sheiretov et al. | |
| 2009/0251829 A1 | 10/2009 | Zhang et al. | |
| 2009/0289694 A1 | 11/2009 | Rieger et al. | |
| 2009/0290053 A1 | 11/2009 | Hammerschmidt | |
| 2010/0045277 A1 | 2/2010 | Goldfine et al. | |
| 2010/0060263 A1 | 3/2010 | Granig et al. | |
| 2011/0025320 A1 | 2/2011 | Ohta et al. | |
| 2011/0068786 A1 | 3/2011 | Miura et al. | |
| 2011/0133728 A1 | 6/2011 | Tokunaga | |
| 2011/0260270 A1* | 10/2011 | Zhang | B82Y 25/00 257/421 |
| 2012/0119735 A1* | 5/2012 | Zimmer | G01R 33/098 324/252 |
| 2012/0156522 A1* | 6/2012 | Maat | B82Y 10/00 428/811.2 |
| 2012/0286382 A1* | 11/2012 | Jan | G01R 33/098 257/421 |
| 2013/0299345 A1 | 11/2013 | Abarra et al. | |
| 2014/0197504 A1* | 7/2014 | Moriyama | G11C 11/161 257/421 |

(56) References Cited

U.S. PATENT DOCUMENTS

| | | | | |
|---|---|---|---|---|
| 2014/0252518 A1* | 9/2014 | Zhang | H01L 43/12 | |
| | | | 257/422 | |
| 2014/0334032 A1* | 11/2014 | Nishioka | G11B 5/127 | |
| | | | 360/75 | |
| 2014/0340791 A1* | 11/2014 | Braganca | G11B 5/3163 | |
| | | | 360/234.4 | |
| 2015/0221326 A1* | 8/2015 | Jung | G11B 5/332 | |
| | | | 360/328 | |
| 2015/0340601 A1* | 11/2015 | Huai | H01L 43/08 | |
| | | | 257/421 | |
| 2016/0005954 A1* | 1/2016 | Erickson | H01L 43/12 | |
| | | | 257/421 | |
| 2016/0282101 A1* | 9/2016 | Kaji | G01B 7/24 | |
| 2017/0148977 A1* | 5/2017 | Zhu | G11C 11/161 | |
| 2017/0154643 A1* | 6/2017 | Nishioka | G11B 5/3912 | |

FOREIGN PATENT DOCUMENTS

| | | |
|---|---|---|
| DE | 19 810 838 | 9/1999 |
| DE | 19 843 348 | 3/2000 |
| DE | 10 222 467 | 12/2003 |
| DE | 10 257 253 | 2/2004 |
| DE | 10 2005 024 879 | 12/2006 |
| DE | 10 2005 042 307 | 3/2007 |
| DE | 10 2006 019 483 | 10/2007 |
| DE | 10 2008 030 334 | 1/2010 |
| EP | 779632 | 6/1997 |
| EP | 0 863 406 | 9/1998 |
| EP | 1 323 856 | 7/2003 |
| EP | 1 336 985 A1 | 8/2003 |
| EP | 1336985 A1 | 8/2003 |
| EP | 1 510 787 | 3/2005 |
| EP | 1 617 472 | 1/2006 |
| EP | 1 666 894 | 6/2006 |
| EP | 1 672 321 | 6/2006 |
| EP | 1 777 440 | 4/2007 |
| EP | 1 918 678 | 5/2008 |
| EP | 1 947 469 | 7/2008 |
| FR | 2 727 778 | 6/1996 |
| FR | 2 729 790 | 7/1996 |
| FR | 2 752 302 | 2/1998 |
| FR | 2 779 395 | 7/1999 |
| FR | 2 774 774 | 8/1999 |
| FR | 2 814 592 | 3/2002 |
| FR | 2 817 998 | 6/2002 |
| FR | 2 817 999 | 6/2002 |
| FR | 2 830 621 | 4/2003 |
| FR | 2 876 800 | 4/2006 |
| FR | 2 889 348 | 2/2007 |
| FR | 2 932 315 | 12/2009 |
| JP | 2000-055997 | 2/2000 |
| JP | 2000-055999 | 2/2000 |
| JP | 2000-056000 | 2/2000 |
| JP | 2001-230471 | 8/2001 |
| JP | 2002-082136 | 3/2002 |
| JP | 2002-267692 | 9/2002 |
| JP | 2002-328140 | 11/2002 |
| JP | 2003-315091 | 11/2003 |
| JP | 2006-214091 | 8/2006 |
| JP | 2007-101253 | 4/2007 |
| JP | 2007-108069 | 4/2007 |
| JP | 2009-014544 | 1/2009 |
| WO | WO 01/67085 | 9/2001 |
| WO | WO 02/084680 | 10/2002 |
| WO | WO 03/032338 | 4/2003 |
| WO | WO 03/104829 | 12/2003 |
| WO | WO 03/107018 | 12/2003 |
| WO | WO 2004/048986 | 6/2004 |
| WO | WO 2004/068152 | 8/2004 |
| WO | WO 2004/068158 | 8/2004 |
| WO | WO 2005/028993 | 3/2005 |
| WO | WO 2006/136577 | 12/2006 |
| WO | WO 2007/095971 | 8/2007 |
| WO | WO 2007/148028 | 12/2007 |
| WO | WO 2007/148029 | 12/2007 |
| WO | WO 2008/012309 | 1/2008 |
| WO | WO 2008/015354 | 2/2008 |
| WO | WO 2009/001160 | 12/2008 |
| WO | WO 2009/001162 | 12/2008 |
| WO | WO 2009/007324 | 1/2009 |
| WO | WO 2009/110892 | 9/2009 |
| WO | WO 2010/001077 | 1/2010 |
| WO | WO 2010/026948 | 3/2010 |
| WO | WO 2010/066976 | 6/2010 |
| WO | WO 2010/084165 | 7/2010 |
| WO | WO 2010/113820 | 10/2010 |
| WO | WO 2010/116102 | 10/2010 |
| WO | WO 2010/136527 | 12/2010 |
| WO | WO 2011/007767 | 1/2011 |
| WO | WO 2010/136527 | 12/2012 |

OTHER PUBLICATIONS

Repetski et al.; "Improved Interfaces and Magnetic Properties in Spin Valves Using $Ni_{80}Fe_{20}$ Seed Layer;" Journal of Applied Physics, vol. 91, No. 6; Mar. 15, 2002; pp. 3891-3895.

Sankaranarayanan et al.; "Exchange Bias Variations of the Seed and Top NiFe Layers in NiFe/FeMn/NiFe Trilayer as a Function of Seed Layer Thickness;" Journal of Magnetism and Magnetic Material 286; Feb. 2005; pp. 196-199.

PCT International Search Report and Written Opinion of the ISA dated Jun. 3, 2015; for PCT Pat. App. No. PCT/US2015/010424; 17 pages.

U.S. Appl. No. 14/452,783, filed Aug. 6, 2014, Fermon et al.

U.S. Appl. No. 14/529,564, filed Oct. 31, 2014, Campigilo et al.

Response to PCT Written Opinion dated Feb. 27, 2017 for EP Pat. Appl. No. 15700938.2; 4 pages.

Amended Claims included with A.A. Thornton response dated Feb. 27, 2017 for EP Pat. Appl. No. 15700938.2; 6 pages.

* cited by examiner

MAGNETORESISTANCE ELEMENT WITH AN IMPROVED SEED LAYER TO PROMOTE AN IMPROVED RESPONSE TO MAGNETIC FIELDS

CROSS REFERENCE TO RELATED APPLICATIONS

This application claims the benefit under 35 U.S.C. §119(e) of U.S. Provisional Application No. 61/925,446 filed Jan. 9, 2014, which application is incorporated herein by reference in its entirety.

STATEMENT REGARDING FEDERALLY SPONSORED RESEARCH

Not Applicable.

FIELD

This invention relates generally to spin electronics magnetoresistance elements and, more particularly, to giant magnetoresistance (GMR) elements and tunnel magnetoresistance (TMR) elements that have an improved seed layer that promotes an improved response to magnetic fields.

BACKGROUND

As used herein, the term "magnetic field sensing element" is used to describe a variety of electronic elements that can sense a magnetic field. One such magnetic field sensing element is a magnetoresistance (MR) element. The magnetoresistance element has a resistance that changes in relation to a magnetic field experienced by the magnetoresistance element.

As is known, there are different types of magnetoresistance elements, for example, a semiconductor magnetoresistance element such as Indium Antimonide (InSb), an anisotropic magnetoresistance element (AMR), a giant magnetoresistance (GMR) element, and a tunneling magnetoresistance (TMR) element, also called a magnetic tunnel junction (MTJ) element. Some of the above magnetoresistance elements are sometimes referred to as spin valves.

Of the above magnetoresistance elements, the GMR and the TMR elements operate with spin electronics (i.e., electron spins) where the resistance is related to the magnetic orientation of different magnetic layers separated by nonmagnetic layers. In spin valve configurations, the resistance is related to an angular direction of a magnetization in a so-called "free-layer" with respect to another layer, a so-called "reference layer." The free layer and the reference layer are described more fully below.

The magnetoresistance element may be a single element or, alternatively, may include two or more magnetoresistance elements arranged in various configurations, e.g., a half bridge or full (Wheatstone) bridge.

As used herein, the term "magnetic field sensor" is used to describe a circuit that uses a magnetic field sensing element, generally in combination with other circuits. In a typical magnetic field sensor, the magnetic field sensing element and the other circuits can be integrated upon a common substrate.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element in response to a magnetic field, and linearity, which is the degree to which the output signal of a magnetic field sensor varies linearly (i.e., in direct proportion) to the magnetic field.

GMR and TMR elements are known to have a relatively high sensitivity, compared, for example, to Hall elements. GMR and TMR elements are also known to have moderately good linearity, but over a restricted range of magnetic fields, more restricted in range than a range over which a Hall element can operate. However, it is known that even in the restricted range of magnetic fields, the linearity of the GMR or TMR element suffers from irregularities. Thus, it would be desirable to provide a GMR or a TMR element for which linearity irregularities are reduced.

Conventional GMR and TMR elements, and, in particular, spin valves, are known to also have an undesirable hysteresis behavior, which reduces their accuracy of magnetic field or current measurements. Thus, it would also be desirable to provide a GMR or TMR element with reduced hysteresis.

SUMMARY

The present invention provides a GMR or a TMR element (or any spin electronics magnetoresistance element) for which linearity irregularities are reduced, and for which hysteresis behavior is reduced.

In accordance with an example useful for understanding an aspect of the present invention, a magnetoresistance element includes a substrate and a seed layer structure disposed over the substrate. The seed layer structure includes at least a ferromagnetic seed layer. The magnetoresistance element also includes a free layer structure disposed over the seed layer structure. The ferromagnetic seed layer comprises a crystalline anisotropy, the crystalline anisotropy induced by deposition of the ferromagnetic seed layer in the presence of a motion along a predetermined direction and in the presence of a predetermined magnetic field having the same predetermined direction, the crystalline anisotropy resulting in the free layer structure having an enhanced preferential magnetic direction.

In accordance with another example useful for understanding another aspect of the present invention, a method of fabricating a magnetoresistance element includes depositing a seed layer structure over a semiconductor substrate. The depositing the seed layer structure includes depositing at least a ferromagnetic seed layer over the substrate. The method further includes depositing a free layer structure over the seed layer structure, wherein the depositing the ferromagnetic seed layer comprises depositing the ferromagnetic seed layer in the presence of a motion along a predetermined direction and in the presence of a predetermined magnetic field having the same predetermined direction, resulting in the ferromagnetic seed layer having an enhanced crystalline anisotropy, and resulting in the free layer structure having an enhanced preferential magnetic direction.

BRIEF DESCRIPTION OF THE DRAWINGS

The foregoing features of the invention, as well as the invention itself may be more fully understood from the following detailed description of the drawings, in which.

DETAILED DESCRIPTION

Before describing the present invention, it should be noted that reference is sometimes made herein to GMR or TMR elements having particular shapes (e.g., yoke shaped). One of ordinary skill in the art will appreciate, however, that the techniques described herein are applicable to a variety of sizes and shapes.

As used herein, the term "anisotropy" or "anisotropic" refer to a particular axis or direction to which the magnetization of a ferromagnetic or ferrimagnetic layer tends to orientate when it does not experience an additional external field. An axial anisotropy can be created by a crystalline effect or by a shape anisotropy, both of which allow two equivalent directions of magnetic fields. A directional anisotropy can also be created in an adjacent layer, for example, by an antiferromagnetic layer, which allows only a single magnetic field direction along a specific axis in the adjacent layer.

In view of the above, it will be understood that introduction of an anisotropy in a magnetic layer results in forcing the magnetization of the magnetic layer to be aligned along that anisotropy in the absence of an external field. In the case of a GMR or TMR element, a directional anisotropy provides an ability to obtain a coherent rotation of the magnetic field in a magnetic layer in response, for example, to an external magnetic field. Directional anisotropy also tends to suppress a hysteresis behavior of the corresponding element.

As used herein, the term "magnetic field sensing element" is used to describe a variety of electronic elements that can sense a magnetic field. A magnetoresistance element is but one type of magnetic field sensing elements. Magnetoresistance elements include, but are not limited to, GMR and TMR elements, some of which can be spin valves.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

Structures and methods described herein apply to both GMR and TMR magnetoresistance elements. However, it should be appreciated that the same or similar structures and methods can apply to other spin electronics magnetoresistance elements, either now known or later discovered. This includes, in particular, oxide based spin electronics structures.

Figure 1:
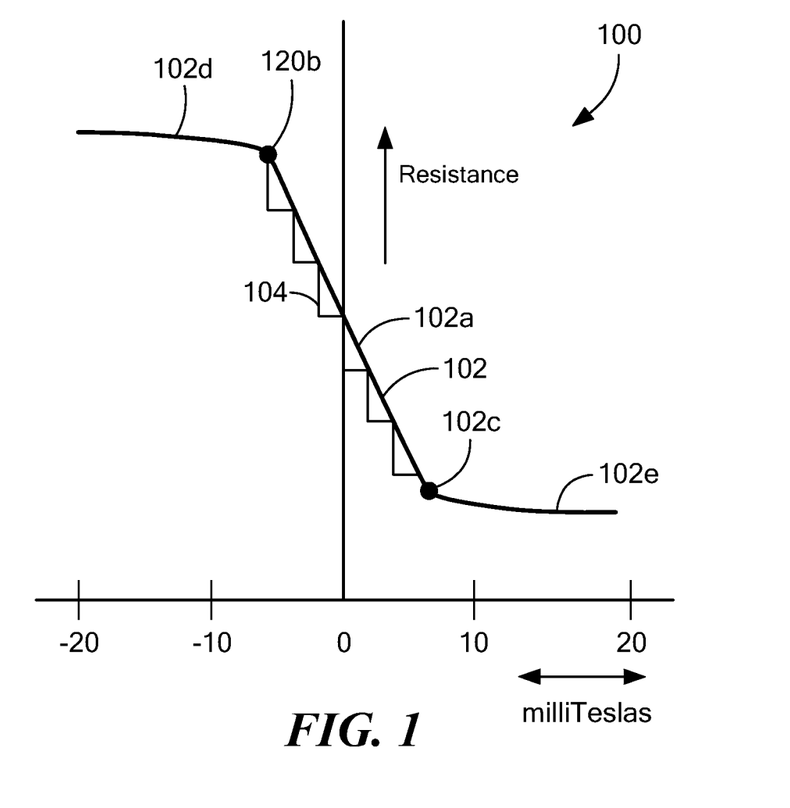
FIG. 1 is a graph showing an ideal and an actual transfer characteristic of a giant magnetoresistance (GMR) element.

Referring now to FIG. 1, a graph 100 has a horizontal axis with a scale in units of magnetic field in milliTesla (mT) and a vertical axis with a scale in units of resistance in arbitrary units.

A curve 102 is representative of a transfer function of an ideal GMR element, i.e., resistance versus magnetic field experienced by the GMR element. The transfer function 102 has a linear region 102*a* between an upper saturation point 102*b* and a lower saturation point 102*c*. Regions 102*d*, 102*e* are in saturation. It should be understood that the linear region 102*a* is an ideal linear region. Furthermore, an ideal GMR element presents the same value of resistance for a given field independent of its magnetic history, i.e., an ideal GMR element has no hysteresis.

Steps, e.g., a step 104, are representative of an actual transfer function of the GMR element. Beyond the saturation points 102*b*, 102*c*, the actual transfer function represented by the steps 104 merges with the saturation regions 102*d*, 102*e*.

The steps 104 are not desirable. The steps 104 result from magnetic behavior of magnetic domains within a so-called free layer in a GMR element. Behavior of the free layer is described more fully below in conjunction with FIG. 2.

While the steps 104 are shown to be regular steps with equal spacing and equal step heights, the steps 104 can also be irregular, with unequal spacing and unequal step heights (i.e., amplitudes). The steps usually correspond to local hysteretic and on reproducible local rotation of the free layer.

Figure 2:
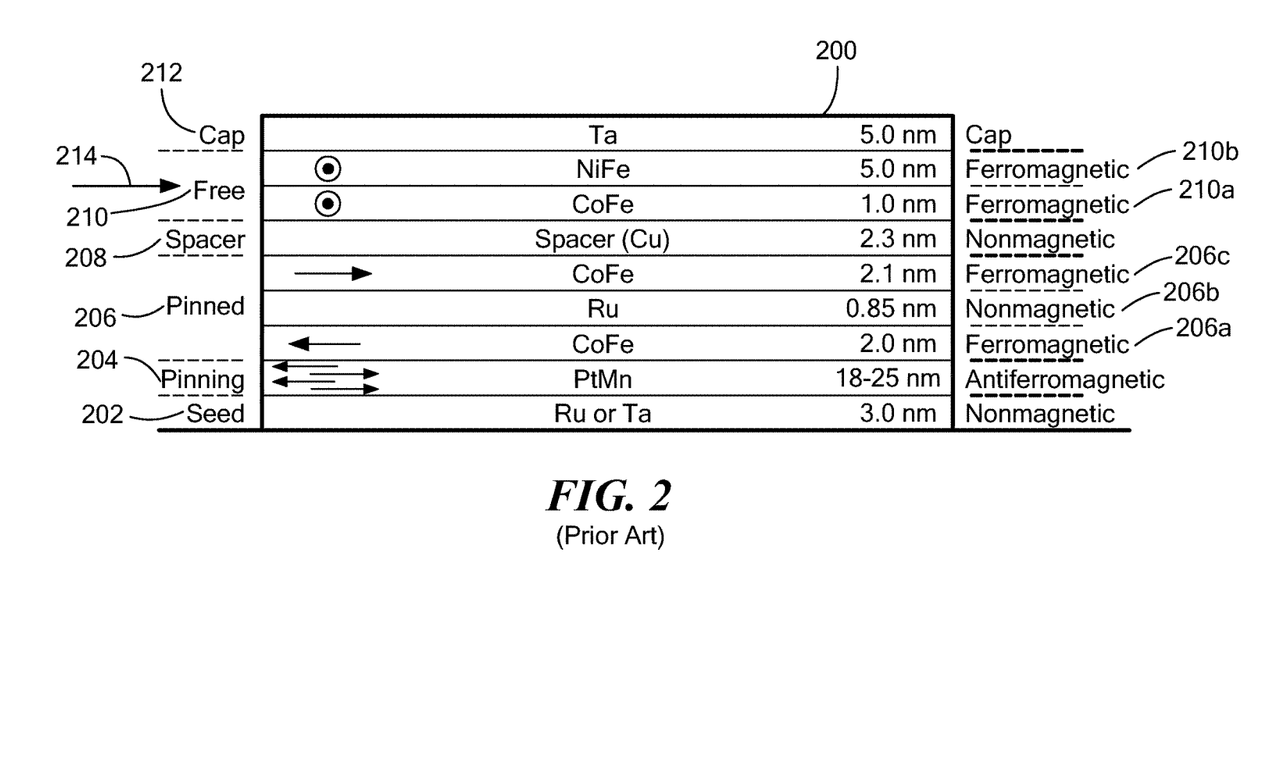
FIG. 2 is a block diagram showing layers of a conventional prior art GMR element with a single pinned arrangement.

Referring now to FIG. 2, a conventional prior art GMR element 200 includes a plurality of layers disposed over a substrate. An upper surface of the substrate is shown as a lowermost line at the bottom of FIG. 2.

On the left side of FIG. 2, each layer is identified by functional name. On the right side or FIG. 2 are shown magnetic characteristics of sub-layers that can form the functional layers. In general, magnetic materials can have a variety of magnetic characteristics and can be classified by a variety of terms, including, but not limited to, ferromagnetic, antiferromagnetic, and nonmagnetic. Description of the variety of types of magnetic materials is not made herein in detail. However, let it suffice here to say, that a ferromagnetic material is one in which magnetic moments of atoms within the ferromagnetic material tend to, on average, align to be both parallel and in the same direction, resulting in a nonzero net magnetic magnetization of the ferromagnetic material.

Most materials like copper, silver, and gold are diamagnetic materials, which do not exhibit a net magnetization. These materials tend to present an extremely weak magnetization opposite and proportional to an applied (external) magnetic field. Diamagnetic materials are also called non-magnetic materials.

An antiferromagnetic material is one in which magnetic moments within the antiferromagnetic material tend to, on average, align to be parallel, but in opposite directions in sub-layers within the antiferromagnetic material, resulting in a zero net magnetization.

As shown, the conventional prior art GMR element 200 can include a seed layer 202 disposed over the substrate, an antiferromagnetic pinning layer 204 disposed over the seed layer 202, and a pinned layer structure 206 disposed over the antiferromagnetic pinning layer 204. The pinned layer structure 206 can be comprised of a first ferromagnetic pinned layer 206a, a second ferromagnetic pinned layer 206c, and a nonmagnetic spacer layer 206b disposed therebetween.

The conventional GMR element 200 can also include a nonmagnetic spacer layer 208 disposed over the second ferromagnetic pinned layer 206c, and a free layer structure 210 disposed over the nonmagnetic spacer layer 208. The nonmagnetic spacer layer 206b can be a nonmagnetic metallic layer. The nonmagnetic spacer layer 208 can be metallic for GMR or insulating for TMR. The free layer structure 210 can be comprised of a first ferromagnetic free layer 210a and a second ferromagnetic free layer 210b.

A cap layer 212 can be disposed over the free layer structure 210 to protect the GMR element 200.

Examples of thicknesses of the layers of the conventional prior art GMR element 200 are shown in nanometers. Examples of materials of the layers of the conventional prior art GMR element are shown by atomic symbols.

Within some layers, arrows are shown that are indicative or directions of magnetic field directions of the layers when the GMR element 200 does not experience an external magnetic field. Arrows coming out of the page are indicated as dots within circles and arrows going into the page are indicated as crosses within circles.

Taking the layers from the bottom upward, the seed layer 202 is used to provide a regular crystalline structure upon the substrate that affects crystal properties of layers above, notably, the PtMn antiferromagnetic pinning layer 204 and layers above.

With regard to the antiferromagnetic pinning layer 204, sub-layers (i.e., layer portions) within the antiferromagnetic pinning layer 204 tend to have magnetic fields that point in alternating different directions indicated by right and left arrows, resulting in the antiferromagnetic pinning layer having a net magnetic field of zero. A top surface of the antiferromagnetic pinning layer 204 tends to have a magnetic moment pointing in one direction, here shown to the left.

With regard to the pinned layer 206, the first ferromagnetic pinned layer 206a tends to couple ferromagnetically to the top surface of the antiferromagnetic pinning layer 204, and thus, the magnetic field in the first ferromagnetic pinned layer 206a can be aligned in parallel to the magnetic moments at the top surface of the antiferromagnetic pinning layer 204, here shown to the left.

Due to the presence of the spacer layer 206b between the first and second ferromagnetic pinned layers 206a, 206c the second ferromagnetic pinned layer 206c tends to couple antiferromagnetically with the first ferromagnetic pinned layer 206a, and thus, it has a magnetic field pointing in the other direction, here shown pointing to the right. The combination of the three layers 206a, 206b, 206c can be referred to as a synthetic antiferromagnetic structure or layer.

The first and second free layers 210a, 210b have respective magnetic fields pointing out of the page in the absence of an external magnetic field. This pointing direction can be achieved by creating a specific anisotropy along a direction pointing out of the page. That anisotropy can be created by a shape of the GMR element or by other considerations described below in conjunction with FIG. 3.

In operation, when the conventional GMR element 200 is exposed to an external magnetic field pointing in a direction of an arrow 214, the magnetic fields in the ferromagnetic free layers 210a, 210b tend to rotate to the right to become more aligned (or fully aligned, i.e., pointing to the right) with the magnetic field pointing direction in the second ferromagnetic pinned layer 206c. However, the magnetic fields in the pinned layer 206 are pinned by the antiferromagnetic pinning layer and do not rotate. The amount of rotation of the magnetic fields in the ferromagnetic free layers 210a, 210b depends upon the magnitude of the external magnetic field. The increased alignment of the magnetic fields in the ferromagnetic free layers 210a, 210b with the direction of the magnetic field in the second ferromagnetic pinned layer 206c tends to make a resistance of the GMR element 200 lower.

Conversely, when the GMR element is exposed to an external field pointing opposite to the direction of the arrow 214, the magnetic fields in the free layer structure 210 tend to rotate to the left to become more anti-aligned (or fully anti-aligned, i.e., pointing to the left) with the magnetic field pointing direction in the second ferromagnetic pinned layer 206c. The amount of rotation depends upon the magnitude of the external magnetic field. The increased anti-alignment of the magnetic fields in the ferromagnetic free layers 210a, 210b with the direction of the magnetic field in the second ferromagnetic pinned layer 206c tends to make a resistance of the GMR element 200 higher.

In view of the above, it will be understood that, referring briefly to FIG. 1, in the absence of an external magnetic field, a resistance of the GMR element 200 is at the center of the linear region 102a, and the resistance can move to the right or to the left on the transfer characteristic curve 102 (i.e., lower or higher) depending upon a direction of the external magnetic field 214. When full alignment or full anti-alignment of layers is achieved, the GMR element 200 will be in the lower saturation region 102e or the upper saturation region 102d, respectively.

In general, the ferromagnetic free layers 210a, 210b tend to naturally have a plurality of magnetic domains, including, but not limited to, a first plurality of magnetic domains with magnetic fields pointing in a first direction and a second plurality of magnetic domains with magnetic fields pointing in one or more other directions. The first plurality of magnetic domains in the ferromagnetic free layers 210a, 210b have magnetic field pointing directions that are aligned with the net magnetic field of the free layer structure 210, shown to be coming out of the page when the GMR element 200 is not exposed to an external magnetic field, but which can rotate as the GMR element 200 is exposed to a magnetic field. As described above, the magnetic field pointing direction of the first plurality of magnetic domains rotates in response to the external magnetic field. The second plurality of magnetic domains tends to have magnetic field pointing directions that point in one or more other directions.

Simply stated, with regard to the steps 104 of FIG. 1, each step is generated when one or more of the magnetic domains that are not within the first plurality of magnetic domains (e.g., that are within the second plurality of magnetic domains), i.e., one or more of the magnetic domains with magnetic fields not pointing in the direction of the net magnetic field in the ferromagnetic free layers 210a, 210b, suddenly snaps (i.e., jumps) in direction to become aligned with the net magnetic field pointing direction of the magnetic field in the ferromagnetic free layers 210a, 210b, wherever the net field in the ferromagnetic free layers 210a, 210b may be pointing (i.e., may have rotated) in response to an external magnetic field. However, it is also possible that one or more of the magnetic domains with magnetic fields not pointing in the direction of the net magnetic field in the ferromagnetic free layers 210a, 210b more slowly transitions in direction to become aligned with the net magnetic field pointing direction of the magnetic field in the ferromagnetic free layers 210a, 210b, in which case one or more of the steps of FIG. 1 would be less steep than those shown, but still undesirable. Thus, it would be desirable to reduce a number of magnetic domains in the free layer structure 210 that point in directions other than the direction of the net magnetic field in the free layer structure 210 (i.e., reduce the quantity of magnetic domains within the second plurality of magnetic domains). This reduction would result in fewer steps 104, smaller steps 104, or no steps 104.

In order to reduce the number of magnetic domains in the free layer 210 that point at directions other than the direction of the net magnetic field of the free layer, i.e., in order to reduce the number of magnetic domains that point in directions other than out of the page, an external biasing magnet can be used. As an alternative, a plurality of layers can be added to the basic GMR element 200 in order to achieve an intra-stack magnetic bias with a so-called "double pinned" arrangement. As a further alternative, a material of the seed layer 202 can be manipulated to achieve an increased anisotropy in layers above.

Figure 3:
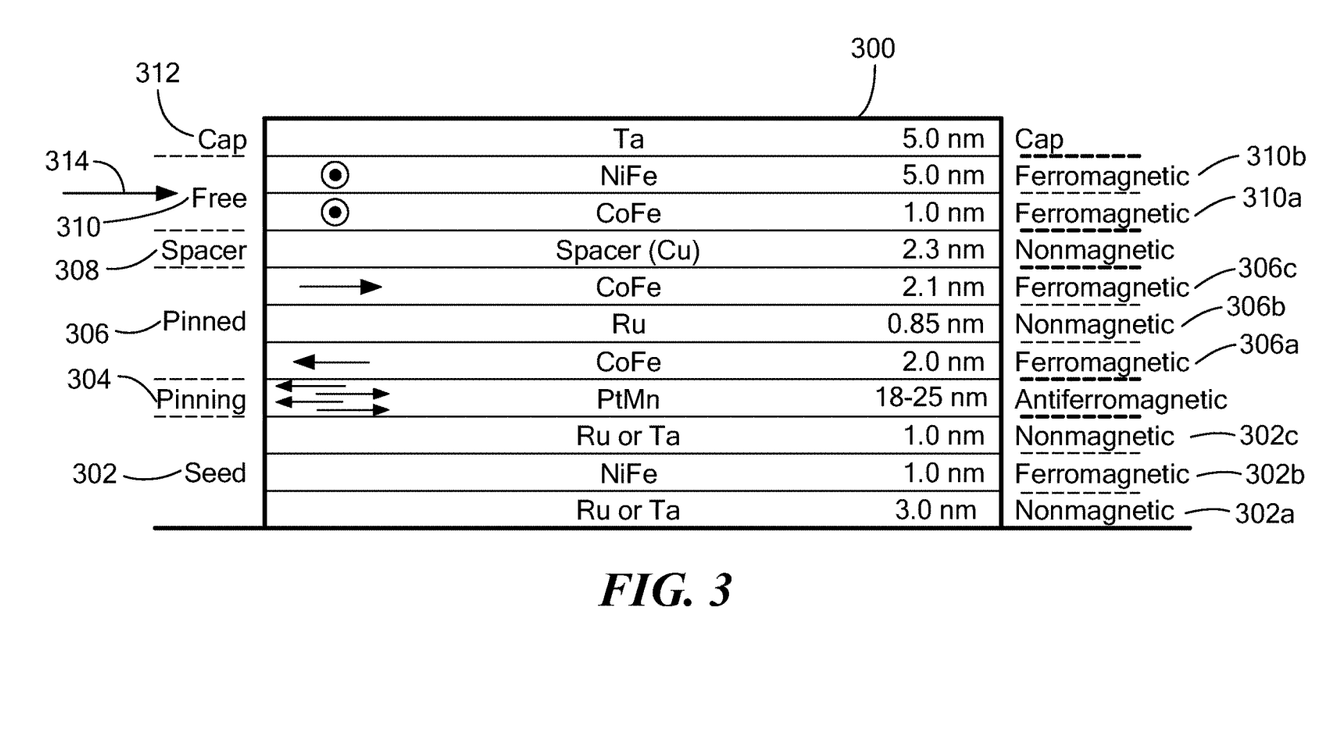
FIG. 3 is a block diagram showing layers of another exemplary GMR element with a single pinned arrangement and having a particular seed layer.

Referring now to FIG. 3, an example of a GMR element 300 includes a plurality of layers disposed over a substrate. An upper surface of the substrate is shown as a lowermost line at the bottom of FIG. 3.

On the left side of FIG. 3, each layer is identified by functional name. On the right side or FIG. 3 are shown magnetic characteristics of sub-layers that can form the functional layers.

As shown, the exemplary GMR element 300 can include a seed layer structure 302 disposed over the substrate. Unlike the seed layer 202 of FIG. 2, the seed layer structure 302 can be comprised of a first nonmagnetic spacer layer 302a, a ferromagnetic seed layer 302b disposed over the first nonmagnetic spacer layer 302a, and a second nonmagnetic spacer layer 302c disposed over the ferromagnetic seed layer 302b. The seed layer structure 302 is described more fully below.

In other embodiments, the seed layer structure 302 omits either the first nonmagnetic spacer layer 302a or the second nonmagnetic spacer layer 302c, but still includes the ferromagnetic seed layer 302b. Thus, in the other embodiments, the seed layer structure 302 includes only one nonmagnetic spacer layer, either above or below the ferromagnetic seed layer 302b.

In general, the nonmagnetic spacer layers 302a or 302c ensure proper crystalline growth of the ferromagnetic seed layer 302b and resulting anisotropy of the GMR element 300, in particular, anisotropy of a free layer structure described below.

An antiferromagnetic pinning layer 304 can be disposed over the seed layer structure 302.

The ferromagnetic seed layer 302b can have a crystalline axis with enhanced consistency, directionality, and definition by depositing the ferromagnetic seed layer 302b at a predetermined temperature (temperature) and predetermined vacuum in the presence of a predetermined magnetic field, the magnetic field having a static direction relative to the GMR element with a primary direction perpendicular to the magnetization of the antiferromagnetic pinning layer 304, which is also parallel to a surface of the substrate. For example, the ferromagnetic seed layer 302b can be deposited without heating (e.g., at room temperature), at a base vacuum of about $1 \times 10^{-8}$ millibars, and in the presence of a magnetic field between about twenty Oersteds and one hundred fifty Oersteds. However, other temperatures, vacuums, and magnetic fields may be possible.

In some other embodiments, temperature can be in the range of about ten degrees Celsius to about fifty degrees Celsius, vacuums can be in the range of about $1 \times 10^{-7}$ millibars to about $1 \times 10^{-10}$ millibars, and magnetic fields can be in the range of about ten to about five hundred Oersteds.

In some embodiments, only the ferromagnetic seed layer 302b is deposited under the above conditions. In some other embodiments, the entire seed layer structure 302 is deposited under the above conditions.

A deposition machine by Singulus® Technologies AG of Germany performs layer deposition with linear translation rather than rotation. Linear translation deposition is well suited for application of a fixed direction magnetic field during deposition of the ferromagnetic seed layer 302b. The direction of the linear motion and the direction of the magnetic field applied during the deposition can be parallel to each other. Either the substrate or the deposition equipment, or both, can move with the linear translation. However, it may also be possible to use a deposition machine that spins a wafer, and to provide a spinning magnetic field accordingly during deposition of the ferromagnetic seed layer 302b.

From the above, it should be appreciated that the ferromagnetic seed layer 302b has a crystalline anisotropy, the crystalline anisotropy induced by deposition of the ferromagnetic seed layer in the presence of the above described motion along a predetermined direction and in the presence of a predetermined magnetic field applied along the same predetermined direction, the crystalline anisotropy resulting in the free layer structure 310 having an enhanced preferential magnetic direction (e.g., an enhanced magnetic anisotropy).

It will be understood that directions of magnetic fields in the antiferromagnetic pinning layer 304 and in the pinned layer structure 306 are the result of annealing at a predetermined temperature and with a predetermined magnetic field. The annealing is not described herein in detail.

In a top view, in some embodiments, the GMR element 300 can have a rectangular shape.

When fabricating a rectangular GMR element, the direction of the magnetic field applied during deposition of the seed layer is along a long axis of the rectangle, which can also be the linear direction of travel of the wafer (or of the deposition equipment) during the deposition of the seed layer structure 302 (or of only the ferromagnetic seed layer 302b). Relative to the cross-sectional view of FIG. 3 and arrows shown thereon, the long axis of such a rectangle would come out of the page.

The exemplary GMR element 300 can also include a pinned layer structure 306 disposed over the antiferromagnetic pinning layer 304. In some embodiments, the pinned layer structure 306 can be comprised of a first ferromagnetic pinned layer 306a, a second ferromagnetic pinned layer 306c, and a nonmagnetic spacer layer 306b disposed there between.

The GMR element 300 can also include a nonmagnetic spacer layer 308 disposed over the pinned layer 306, and a free layer structure 310 disposed over the nonmagnetic spacer layer 308. In some embodiments, the free layer structure 310 can be comprised of a first ferromagnetic free layer 310a disposed under a second ferromagnetic free layer 310b.

A cap layer 312 can be disposed at the top of the GMR element 300 to protect the GMR element 300.

Within some layers, arrows are shown that are indicative or directions of magnetic fields of the layers when the GMR element 300 does not experience an external magnetic field. Arrows coming out of the page are indicated as dots within circles and arrows going into the page are indicated as crosses within circles.

Thicknesses of the layers of the exemplary GMR element 300 are shown in nanometers. Materials of the layers of the exemplary GMR element 300 are shown by atomic symbols.

Accordingly, in some embodiments, the nonmagnetic seed layer 302a is comprised of Ru or Ta, the ferromagnetic seed layer 302b is comprised of NiFe (or alternatively, NiFeCr, CoFe, CoFeB, or CoFeCr alloy), the first nonmagnetic spacer layer 302c is comprised of Ru or Ta, the antiferromagnetic layer pinning 304 is comprised of PtMn, the first pinned ferromagnetic layer 306a is comprised of CoFe, the second nonmagnetic spacer layer 306b is comprised of Ru, the second pinned ferromagnetic layer 306c is comprised of CoFe, the third nonmagnetic spacer layer 308 is comprised of Cu (or alternatively, Au, or Ag), the first ferromagnetic free layer 310a is comprised of CoFe, the second ferromagnetic free layer 310b is comprised of NiFe, and the cap layer 312 is comprised of Ta. However, other materials are also possible.

In some other embodiments, the antiferromagnetic pinning layer 304 is comprised of IrMn, FeMn, or NiMn.

The ferromagnetic seed layer 302b comprised of NiFe gives the GMR element 300 particular structural, and therefore, operational characteristics. In particular, by deposition techniques described above, it will be understood that NiFe (or alternatively, NiFeCr, CoFe, CoFeB, or CoFeCr alloy) has a crystalline axis with high degree of consistency, directionality, and definition, more than the crystallization of a conventional nonmagnetic seed layer, e.g., the conventional Ru or Ta seed layer 202 of FIG. 2. The high crystallization of the ferromagnetic seed layer 302b propagates in subsequent layers to cause a high degree of crystallization in layers above the ferromagnetic seed layer 302b. In particular, this induces a preferential magnetic direction axis of the free layer structure 310.

The seed layer structure 302 promotes a growth-induced anisotropy. Two directions along a magnetization axis become energetically favorable with respect to the all the other possible directions. As a consequence, there is a reduction in the number of magnetic domains in the free layer structure 310 that have magnetic fields pointing in directions other than the direction of the net magnetic field in the free layer structure 310.

Having a higher degree of crystallization, the free layer structure 310 tends to promote magnetic domains with magnetic fields oriented in a first direction and to reduce the number of magnetic domains with magnetic fields point in the above describe one or more second different directions.

Thus, with regard to the steps 104 of FIG. 1, the promotion of the magnetic domains with fields pointing in the first direction, i.e., aligned with the fields in the free layer structure 310 as the field in the free layer structure 310 rotates, tends to reduce the number of magnetic field domains with magnetic field pointing in the one or more second different other directions. This reduction results in fewer steps 104, smaller steps 104, or no steps 104. The reduction can include a reduction in a quantity of magnetic domains within the above second plurality of magnetic domains. Hysteresis can also be reduced.

Figure 4:
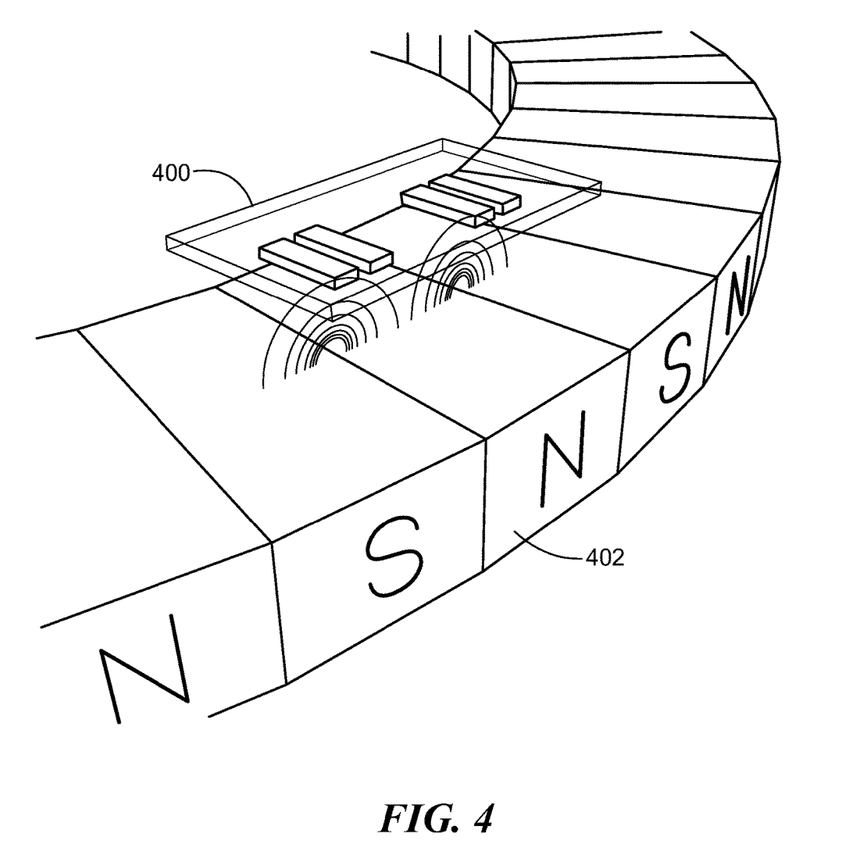
FIG. 4 is a block diagram of a magnetoresistance element magnetic field sensor placed above a magnetic target for rotation speed measurement.

Referring now to FIG. 4, a magnetic field sensor 400 can include one or more magnetoresistance elements. Here, four magnetoresistance elements, which can be of a type described above in conjunction with FIG. 3, are arranged over a common substrate. The four magnetoresistance elements can be arranged in a bridge. Other electronic components (not shown), for example, amplifiers and processors, can also be integrated upon the common substrate.

The magnetic field sensor 400 can be disposed proximate to a moving magnetic object, for example, a ring magnet 402 having alternating north and south magnetic poles. The ring magnet 402 is subject to rotation.

The magnetic field sensor 400 can be configured to generate an output signal indicative of at least a speed of rotation of the ring magnet. In some arrangements, the ring magnet 402 is coupled to a target object, for example, a cam shaft in an engine, and the sensed speed of rotation of the ring magnet 402 is indicative of a speed of rotation of the target object.

While the magnetic field sensor 400 is used as a rotation detector, it should be understood that other similar magnetic field sensors, for example, current sensors, can have one or more of the magnetoresistance elements of FIG. 3.

While a single pinned GMR element is described above in conjunction with FIG. 3, it should be understood that the seed layer structure 302 of FIG. 3 can be a seed layer structure in a double pinned arrangement or part of an arrangement with still further pinning and/or pinned layers.

Examples of double pinned arrangements that can use the seed layer 302 can be found, for example, is U.S. patent application Ser. No. 14/452,783, filed Aug. 6, 2014 and in U.S. patent Ser. No. 14/529,564, filed Oct. 31, 2014, both of which are assigned to the assignee of the present invention and both of which are incorporated by reference herein in their entirety.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetoresistance element, comprising:
   a substrate;
   a seed layer structure disposed over the substrate, the seed layer structure comprising:
      a ferromagnetic seed layer consisting of a binary alloy of NiFe; and
      a first nonmagnetic spacer layer disposed under and directly adjacent to the ferromagnetic seed layer and proximate to the substrate, wherein the first nonmagnetic spacer layer is comprised of Ta or Ru, the magnetoresistance element further comprising:
   a free layer structure disposed over the seed layer structure, wherein the ferromagnetic seed layer comprises a crystalline anisotropy, such that the free layer structure is promoted by the seed layer structure to have magnetic domains with magnetic fields oriented in a first direction and to reduce the number of domains with magnetic fields pointing in one or more second different directions.

2. The magnetoresistance element of claim 1, wherein the seed layer structure further comprises a second nonmagnetic spacer layer disposed over and proximate to or to the ferromagnetic seed layer, wherein the second nonmagnetic spacer layer is comprised of Ta or Ru.

3. The magnetoresistance element of claim 2, wherein the predetermined magnetic field is between about twenty Oersteds and one hundred fifty Oersteds.

4. The magnetoresistance element of claim 2, wherein the first and second nonmagnetic spacer layers are each comprised of Ru.

5. The magnetoresistance element of claim 2, wherein the first and second nonmagnetic spacer layers are each comprised of Ta.

6. The magnetoresistance element of claim 2, wherein one of the first and second nonmagnetic spacer layers is comprised of Ru and the other one of the first and second nonmagnetic spacer layers is comprised of Ta.

7. The magnetoresistance element of claim 1, further comprising:
an antiferromagnetic pinning layer disposed over the seed layer structure and under the free layer structure.

8. The magnetoresistance element of claim 7, wherein the antiferromagnetic pinning layer is comprised of PtMn.

9. The magnetoresistance element of claim 7, wherein the antiferromagnetic pinning layer is comprised of PtMn, IrMn, or FeMn.

10. The magnetoresistance element of claim 7, further comprising:
a pinned layer structure disposed over the antiferromagnetic pinning layer and under the free layer structure.

11. The magnetoresistance element of claim 10, wherein the pinned layer structure comprises:
a first ferromagnetic pinned layer disposed over the antiferromagnetic pinning layer
a third non magnetic spacer layer disposed over the first pinned ferromagnetic layer; and
a second ferromagnetic pinned layer disposed over the third nonmagnetic spacer layer.

12. The magnetoresistance element of claim 11, wherein the first and second ferromagnetic pinned layers are comprised of CoFe and the third nonmagnetic spacer layer is comprised of Ru.

13. The magnetoresistance element of claim 10, further comprising:
a fourth nonmagnetic spacer layer disposed between the pinned layer structure and the free layer structure.

14. The magnetoresistance element of claim 13, wherein the fourth nonmagnetic spacer layer is comprised of Cu, Au, or Ag.

15. The magnetoresistance element of claim 13, wherein the free layer structure comprises:
a first ferromagnetic free layer disposed over the fourth nonmagnetic spacer layer; and
a second ferromagnetic free layer disposed over the first ferromagnetic free layer.

16. The magnetoresistance element of claim 15, wherein the first ferromagnetic free layer is comprised of CoFe and the second ferromagnetic free layer is comprised of NiFe.

17. The magnetoresistance element of claim 1, wherein the free layer structure comprises a plurality of magnetic domains, the plurality of magnetic domains comprising:
a first plurality of magnetic domains with magnetic fields pointing in a first direction; and
a second plurality of magnetic domains with magnetic fields pointing in one or more directions different than the first direction,
wherein a material of the ferromagnetic seed layer results in a selected reduction in a quantity of magnetic domains within the second plurality of magnetic domains in the free layer structure.

18. The magnetoresistance element of claim 1, wherein the crystalline anisotropy induced by deposition of the ferromagnetic seed layer in the presence of a motion along a predetermined direction and in the presence of a predetermined magnetic field having the same predetermined direction, the crystalline anisotropy resulting in the free layer structure having an enhanced preferential magnetic direction.

19. A method of fabricating a magnetoresistance element, comprising:
depositing a seed layer structure over a semiconductor substrate, wherein the depositing the seed layer structure comprises:
depositing at least a ferromagnetic seed layer over the substrate, wherein the method further comprises:
depositing a free layer structure over the seed layer structure, wherein the depositing the ferromagnetic seed layer comprises depositing the ferromagnetic seed layer in the presence of a motion along a predetermined direction and in the presence of a predetermined magnetic field having the same predetermined direction, resulting in the ferromagnetic seed layer having an enhanced crystalline anisotropy, and resulting in the free layer structure having an enhanced preferential magnetic direction.

20. The method of claim 19, wherein the depositing the seed layer structure further comprises:
depositing a second nonmagnetic spacer layer over and proximate to or under and proximate to the ferromagnetic seed layer.

21. The method of claim 20, wherein the ferromagnetic seed layer is comprised of NiFe, NiFeCr, CoFe, CoFeB, or CoFeCr.

22. The method of claim 19, wherein the ferromagnetic seed layer is comprised of NiFe, NiFeCr, CoFe, CoFeB, or CoFeCr.

23. The method of claim 22, wherein the predetermined magnetic field is between about twenty Oersteds and one hundred fifty Oersteds.

24. The method of claim 19, wherein the depositing the seed layer structure further comprises:
depositing a first nonmagnetic spacer layer under and proximate to the ferromagnetic seed layer; and
depositing a second nonmagnetic spacer layer over and proximate to the ferromagnetic seed layer.

25. The method of claim 24, wherein the ferromagnetic seed layer is comprised of NiFe, NiFeCr, CoFe, CoFeB, or CoFeCr.

26. The method of claim 25, wherein one of the first and second nonmagnetic spacer layers is comprised of Ru and the other one of the first and second nonmagnetic spacer layers is comprised of Ta, both the first and second nonmagnetic spacer layers are comprised of Ru, or both the first and second nonmagnetic spacer layers are comprised of Ta.

27. The method of claim 19, further comprising:
depositing an antiferromagnetic pinning layer over the seed layer structure; and
annealing the antiferromagnetic pinning layer using an annealing magnetic field having a primary direction parallel to the predetermined direction of the predetermined magnetic field used in the depositing the ferromagnetic seed layer.

28. The method of claim 27, wherein the ferromagnetic seed layer is comprised of NiFe, NiFeCr, CoFe, CoFeB, or CoFeCr.

29. The method of claim 28, wherein the predetermined magnetic field is between about twenty Oersteds and one hundred fifty Oersteds.

30. The method of claim 27, further comprising:
depositing a pinned layer structure between the antiferromagnetic pinning layer and the free layer structure.

31. The method of claim 30, wherein the ferromagnetic seed layer is comprised of NiFe, NiFeCr, CoFe, CoFeB, or CoFeCr.

32. A method of fabricating a magnetoresistance element, comprising:
depositing a seed layer structure over a semiconductor substrate, wherein the depositing the seed layer structure comprises:
depositing a ferromagnetic seed layer consisting of a binary alloy of NiFe; and
depositing a first nonmagnetic spacer layer disposed under and directly adjacent to the ferromagnetic seed layer and proximate to the substrate, wherein the first nonmagnetic spacer layer is comprised of Ta or Ru, wherein the method further comprises:
depositing a free layer structure over the seed layer structure, wherein the depositing the ferromagnetic seed layer comprises depositing the ferromagnetic seed layer in the presence of a motion along a predetermined direction and in the presence of a predetermined magnetic field having the same predetermined direction, resulting in the ferromagnetic seed layer having a greater crystalline anisotropy such that the free layer structure is promoted by the seed layer structure to have magnetic domains with magnetic fields oriented in a first direction and to reduce the number of domains with magnetic fields pointing in one or more second different directions.

33. The method of claim 32, wherein the depositing the seed layer structure further comprises:
depositing a second nonmagnetic spacer layer over and proximate to the ferromagnetic seed layer, wherein the second nonmagnetic spacer layer is comprised of Ta or Ru.

34. The method of claim 33, wherein the predetermined magnetic field is between about twenty Oersteds and one hundred fifty Oersteds.

35. The method of claim 33, wherein one of the first and second nonmagnetic spacer layers is comprised of Ru and the other one of the first and second nonmagnetic spacer layers is comprised of Ta, both the first and second nonmagnetic spacer layers are comprised of Ru, or both the first and second nonmagnetic spacer layers are comprised of Ta.

36. The method of claim 32, further comprising:
depositing an antiferromagnetic pinning layer over the seed layer structure; and
annealing the antiferromagnetic pinning layer using an annealing magnetic field having a primary direction parallel to the predetermined direction of the predetermined magnetic field used in the depositing the ferromagnetic seed layer.

37. The method of claim 36, further comprising:
depositing a pinned layer structure between the antiferromagnetic pinning layer and the free layer structure.

38. The method of claim 32, wherein the crystalline anisotropy induced by deposition of the ferromagnetic seed layer in the presence of a motion along a predetermined direction and in the presence of a predetermined magnetic field having the same predetermined direction, the crystalline anisotropy resulting in the free layer structure having an enhanced preferential magnetic direction.

39. A magnetoresistance element, comprising:
a substrate;
a seed layer structure disposed over the substrate, the seed layer structure comprising a ferromagnetic seed layer;
a first nonmagnetic spacer layer disposed under and proximate to the ferromagnetic seed layer;
a second nonmagnetic spacer layer disposed over and proximate to the ferromagnetic seed layer, wherein the first and second nonmagnetic spacer layers are comprised of Ta or Ru; and
a free layer structure disposed over the seed layer structure, wherein the ferromagnetic seed layer comprises a crystalline anisotropy, the crystalline anisotropy induced by deposition of the ferromagnetic seed layer in the presence of a motion along a predetermined direction and in the presence of a predetermined magnetic field having the same predetermined direction, the crystalline anisotropy resulting in the free layer structure having an enhanced preferential magnetic direction.

40. The magnetoresistance element of claim 39, wherein the ferromagnetic seed layer consists of a binary alloy of NiFe.

* * * * *

UNITED STATES PATENT AND TRADEMARK OFFICE
CERTIFICATE OF CORRECTION

PATENT NO. : 9,804,234 B2  
APPLICATION NO. : 14/591213  
DATED : October 31, 2017  
INVENTOR(S) : Cyril Dressler et al.

Page 1 of 1

It is certified that error appears in the above-identified patent and that said Letters Patent is hereby corrected as shown below:

Abstract, (57), delete "method fabricating" and replace with --method--.

Abstract, (57), delete "method further" and replace with --method--.

Column 3, Line 55, delete "elements" and replace with --element--.

Column 5, Line 29, delete "or directions" and replace with --of directions--.

Column 7, Line 10, delete "steps of" and replace with --steps 104 of--.

Column 7, Line 63, delete "temperature (temperature)" and replace with --temperature (room temperature)--.

Column 8, Line 18, delete "Singulus® Technologies" and replace with --Singulus®Technologies--.

Column 9, Line 7, delete "or directions" and replace with --of directions--.

Column 9, Line 48, delete "the all the" and replace with --all the--.

Column 10, Line 32, delete "is" and replace with --in--.

Column 10, Line 45, delete "that that scope" and replace with --that the scope--.

Column 11, Line 3, delete "to or to the" and replace with --to the--.

Column 11, Line 36, delete "non magnetic" and replace with --nonmagnetic--.

Signed and Sealed this  
Eighth Day of January, 2019

Andrei Iancu  
*Director of the United States Patent and Trademark Office*